US009049519B2

(12) United States Patent
Blore et al.

(10) Patent No.: US 9,049,519 B2

(45) Date of Patent: Jun. 2, 2015

(54) ACOUSTIC HORN GAIN MANAGING

(75) Inventors: David Edwards Blore, Westborough, MA (US); Paul F. Fidlin, Wayland, MA (US); Soichiro Hayashi, Framingham, MA (US)

(73) Assignee: Bose Corporation, Framingham, MA (US)

(*) Notice: Subject to any disclaimer, the term of this patent is extended or adjusted under 35 U.S.C. 154(b) by 877 days.

(21) Appl. No.: 13/030,656

(22) Filed: Feb. 18, 2011

(65) Prior Publication Data

US 2012/0213387 A1 Aug. 23, 2012

(51) Int. Cl.
*H03G 3/00* (2006.01)
*H04R 1/30* (2006.01)
(Continued)

(52) U.S. Cl.
CPC .................. *H04R 1/30* (2013.01); *H04R 1/345* (2013.01); *H04R 1/36* (2013.01); *H04R 3/12* (2013.01)

(58) Field of Classification Search
CPC .. H04R 1/30; H04R 2499/13; H04R 2440/01; H04R 2430/01; H04R 2430/25; H04R 2420/01; H04R 2420/03; H04R 2400/13; H04R 2203/12; H04R 2227/009; H04R 2201/34; H04R 2201/40; H04R 2201/401; H04R 2201/403; H04R 2201/405; H04R 5/02; H04R 5/023; H04R 5/04; G10K 11/025; H04S 3/002; H04S 3/008; H04S 3/006; H04S 5/005; H04S 5/02; H04S 7/302; H04S 7/303; H04S 7/307; H04S 7/308; H04S 2400/11; H04S 2400/13; H04S 2420/13
USPC ........... 381/77, 78, 80, 81, 82, 84, 85, 61, 17, 381/18, 19, 20, 21, 22, 300, 303, 304, 305, 381/307, 308, 27, 28, 86, 89, 332, 336, 97, 381/98, 101, 102, 103, 104, 107, 109, 340, 381/341, 342, 182, 111, 150, 337, 386; 181/144, 192, 177, 159, 132, 175, 179, 181/195, 198, 199
See application file for complete search history.

(56) References Cited

U.S. PATENT DOCUMENTS

| | | |
|---|---|---|
| 2,089,391 A | 8/1937 | Marion |
| 3,234,559 A | 2/1966 | Bartholoma |

(Continued)

FOREIGN PATENT DOCUMENTS

| | | | |
|---|---|---|---|
| CN | 1496552 A | 5/2004 | |
| CN | 201290172 Y | 8/2009 | |

(Continued)

OTHER PUBLICATIONS

"Constant-Voltage Audio Distribution Systems" by Dennis Bohn, Rane Corporation, RaneNote 136, last revised on Mar. 2007, pp. 1-6.*

(Continued)

*Primary Examiner* — Leshui Zhang

(57) ABSTRACT

A horn loudspeaker with gain shading. The horn loudspeaker includes an acoustic horn. The acoustic horn includes side walls, for determining the horizontal dispersion angle of the acoustic horn, top and bottom walls, for determining the vertical dispersion angle of the acoustic horn, and a plurality of acoustic drivers coupled to the acoustic horn by a diffraction slot having segments. Each of the segments is separated from the adjacent segments by less than one half of the wavelength of the highest frequency of the operational range of the horn loudspeaker. The horn loudspeaker further includes circuitry for transmitting an audio signal to the plurality of acoustic drivers, the circuitry comprising a first signal attenuation element electrically coupling an audio signal input element and a first of the acoustic drivers.

17 Claims, 8 Drawing Sheets

(51) Int. Cl.

| | |
|---|---|
| ***H04R 1/34*** | (2006.01) |
| ***H04R 1/36*** | (2006.01) |
| ***H04R 3/12*** | (2006.01) |

(56) References Cited

U.S. PATENT DOCUMENTS

| | | | | |
|---|---|---|---|---|
| 3,370,125 | A * | 2/1968 | Shaw et al. | 381/120 |
| 3,977,006 | A | 8/1976 | Miersch | |
| 4,171,734 | A | 10/1979 | Peveto et al. | |
| 4,308,932 | A | 1/1982 | Keele, Jr. | |
| 4,344,504 | A | 8/1982 | Howze | |
| 4,629,029 | A | 12/1986 | Gunness | |
| 4,845,759 | A | 7/1989 | Danley | |
| 4,882,562 | A | 11/1989 | Andrews et al. | |
| 4,969,196 | A | 11/1990 | Nakamura | |
| 5,325,439 | A | 6/1994 | Smiley | |
| 5,526,456 | A | 6/1996 | Heinz | |
| 5,590,214 | A | 12/1996 | Nakamura | |
| 5,715,322 | A | 2/1998 | Yoshioka et al. | |
| 5,750,943 | A | 5/1998 | Heinz | |
| 5,925,856 | A | 7/1999 | Meyer et al. | |
| 6,009,182 | A | 12/1999 | Gunness | |
| 6,016,353 | A | 1/2000 | Gunness | |
| 6,059,069 | A | 5/2000 | Hughes | |
| 6,112,847 | A | 9/2000 | Lehman | |
| 6,116,373 | A | 9/2000 | Dodd | |
| 6,343,133 | B1 | 1/2002 | Adamson | |
| 6,393,131 | B1 | 5/2002 | Rexroat | |
| 6,394,223 | B1 | 5/2002 | Lehman | |
| 6,581,719 | B2 | 6/2003 | Adamson | |
| 6,668,969 | B2 | 12/2003 | Meyer et al. | |
| 6,712,177 | B2 | 3/2004 | Ureda | |
| 6,744,899 | B1 | 6/2004 | Grunberg | |
| 6,950,530 | B2 | 9/2005 | Baird et al. | |
| 7,044,265 | B2 | 5/2006 | Murphy | |
| 7,177,437 | B1 | 2/2007 | Adams | |
| 7,236,606 | B2 | 6/2007 | Werner | |
| 7,275,621 | B1 | 10/2007 | Delgado, Jr. | |
| 7,278,513 | B2 | 10/2007 | Brawley, Jr. | |
| 7,299,893 | B2 | 11/2007 | Meyer et al. | |
| 7,392,880 | B2 | 7/2008 | Buck | |
| 7,454,029 | B2 | 11/2008 | Andrews | |
| 7,590,257 | B1 | 9/2009 | Blanchard et al. | |
| 7,708,112 | B2 | 5/2010 | Geddes | |
| 2001/0040974 | A1 | 11/2001 | Steckling | |
| 2002/0014368 | A1 | 2/2002 | Adamson | |
| 2002/0029926 | A1 | 3/2002 | Vincenot et al. | |
| 2002/0038740 | A1 | 4/2002 | Ureda | |
| 2002/0150270 | A1 * | 10/2002 | Werner | 381/342 |
| 2003/0133584 | A1 | 7/2003 | Werner | |
| 2003/0188920 | A1 | 10/2003 | Brawley | |
| 2003/0219139 | A1 | 11/2003 | Baird et al. | |
| 2004/0005069 | A1 | 1/2004 | Buck | |
| 2004/0245043 | A1 | 12/2004 | Noselli et al. | |
| 2005/0217927 | A1 | 10/2005 | Noselli et al. | |
| 2006/0169530 | A1 | 8/2006 | Noselli et al. | |
| 2007/0086615 | A1 | 4/2007 | Cheney | |
| 2007/0102232 | A1 | 5/2007 | Geddes | |
| 2007/0223713 | A1 | 9/2007 | Gunness | |
| 2008/0059132 | A1 | 3/2008 | Zander et al. | |
| 2008/0085026 | A1 | 4/2008 | Engebretson et al. | |
| 2009/0323996 | A1 | 12/2009 | Danley | |

FOREIGN PATENT DOCUMENTS

| | | | |
|---|---|---|---|
| DE | 202005020757 | U1 | 7/2006 |
| EP | 457487 | A2 * | 11/1991 |
| EP | 0457487 | A2 | 11/1991 |
| EP | 0880300 | A2 | 11/1998 |
| EP | 1178702 | A2 | 2/2002 |
| EP | 1330936 | A1 | 7/2003 |
| EP | 1333698 | A2 | 8/2003 |
| EP | 1686830 | A1 | 8/2006 |
| JP | S4869325 | U | 12/1971 |
| JP | S5075636 | U | 7/1975 |
| JP | S51148935 | U | 11/1976 |
| JP | 60-081999 | A | 5/1985 |
| JP | S6341992 | U | 3/1988 |
| JP | H04505241 | A | 9/1992 |
| JP | H06078389 | A | 3/1994 |
| JP | H08505034 | A | 5/1996 |
| JP | 9139993 | A | 5/1997 |
| JP | 2001061200 | A | 3/2001 |
| JP | 2004064507 | A | 2/2004 |
| JP | 2007026222 | A | 2/2007 |
| JP | 2009065609 | A | 3/2009 |
| WO | 9911098 | A1 | 3/1999 |
| WO | WO 0108478 | A1 * | 2/2001 |
| WO | 0225991 | A1 | 3/2002 |
| WO | 02074030 | A1 | 9/2002 |
| WO | 03030583 | A2 | 4/2003 |
| WO | 03061342 | A1 | 7/2003 |
| WO | 03086016 | A1 | 10/2003 |
| WO | 03088206 | A2 | 10/2003 |
| WO | 2006088380 | A1 | 8/2006 |
| WO | 2007054709 | A2 | 5/2007 |
| WO | 2008112175 | A1 | 9/2008 |
| WO | 2011031415 | A1 | 3/2011 |

OTHER PUBLICATIONS

EVA Series User Manual, Electro-Voice, Live for Sound. Dec. 2008.

JBL Professional Technical Notes vol. 1, No. 35, CBT Constant Beamwidth Technology. TN V.1 No. 35. Oct. 2009.

Keele, Jr., D.B.; JBL Incorporated, A Loudspeaker Horn That Covers a Flat Rectangular Area from an Oblique Angle, Audio Engineering Society, presented at the 74th Convention, New York. Oct. 8-12, 1983.

International Search Report and the Written Opinion of the International Searching Authority dated Aug. 22, 2012 for PCT/US2012/024457.

Jens Moller, Shavano Music Online "Speaker Wiring—70 Volt Transformer Systems", Dec. 14, 2010, XP002681235, URL: http://web.archive.org/web/20101214015422/http://colomar.com/Shavano/spkr_wiringtr.html Retrieved on Aug. 2, 2012.

Invitation to Pay Additional Fees dated Jun. 6, 2012 for International Application No. PCT/US2012/024457.

Engebretson, Mark, QSC White Paper, Advanced Loudspeaker Tuning Techniques QSC Intrinsic Correction, Dated Sep. 7, 2007, 12 pages.

Saraceno, Steven. Eastern Acoustic Works, Loudspeaker Enclosures Materials and Manufacturing Technology, One Main Street, Whitinsiville, MA 01588, http://www.eaw.com, 4 pages.

Ureda, Mark S. Audio Engineering Society Convention Paper 5304 Presented at the 110th Convention May 12-15, 2001 Amsterdam, The Netherlands, Line Arrays: Theory and Applicatiohns, 12 pages.

Ureda, Mark S. Audio Engineering Society Convention Paper Presented at the 111th Convention Sep. 21-24, 2001, New York, NY, USA, 10 pages.

Geo Innovation Analysis, Nexo, Reflective Wavesource Technology Using Geometrical Transformation of Conicoids, GEO Reflective Wavesource Technology, 26 pages, Jul. 15, 2002.

Geo Application Analysis from the innovators of NEXO, Coincoid Reflective Wavesource Technology and Tangent Array Design & Applications, Audio reporduction for live audiences: success criteria., 18 pages, Jul. 15, 2002.

Ureda, Mark S. Analysis of Loudspeaker Line Arrays, JBL Professional Northbridge, CA 91329, USA, J. Audio Eng. Soc., vol. 52, No. 5, May 2004, pp. 467-495.

Invitation to Pay Additional Fees dated Oct. 5, 2010 for PCT/US10/045571.

First Japanese Office Action dated Aug. 5, 2014 for JP Application No. 2013-554485 with English translation.

VRX932LA-JBL VRX932LA-1, 12" Two-Way Constant Curvature Line Array, Northridge, California 91329 U.S.A., 2007.

International Search Report and Written Opinion dated Feb. 14, 2011 for PCT/US10/045571.

Anonymous: Mapp Online Pro 2.8 User Guide, Meyer Sound. Retrieved from the Internet on Jan. 26, 2011: http:/www.meyersound.com/products/mapponline/pro/pdfs/mapppro_ug_2.8.54.pdf.

(56) References Cited

OTHER PUBLICATIONS

Johansen: On the Directivity of Horn Loudspeakers, Journal of the Audio Engineering Society, vol. 42, No. 12, Dec. 1994.
International Search Report and Written Opinion dated Dec. 14, 2011 for PCT/US2011/053635.
Prohs J R et al: "An Accurate and Easily Implemented Method of Modeling Loudspeaker Array Coverage", Journal of the Audio Engineering Society, Audio Engineering Society, New York, NY, US, vol. 32, No. 4, Apr. 1, 1984, pp. 204-217, XP000763028, ISSN: 1549-4950.
Extended European Search Report dated Jan. 23, 2013 for Application No./Patent No. 12156119.5-2225 / 2493210.
Australian Patent Examination Report No. 1 dated Mar. 22, 2013 for AU Application No. 2010292825.
International Preliminary Report on Patentability dated Apr. 9, 2013 for PCT/US2011/053635.
First Japanese Office Action dated May 21, 2013 for JP Application No. 2012-528804 with English translation.
First Chinese Office Action dated Mar. 5, 2014 for CN Application No. 201210097445.7.
First Chinese Office Action dated Feb. 8, 2014 for CN Application No. 201080039314.2.
English translation of First Chinese Office Action dated Feb. 8, 2014 for CN Application No. 201080039314.2.
English translation of First Chinese Office Action dated Mar. 5, 2014 for CN Application No. 201210097445.7.
First Japanese Office Action dated May 27, 2014 for Japanese Patent Application No. 2013-532835.

* cited by examiner

Fig. 3
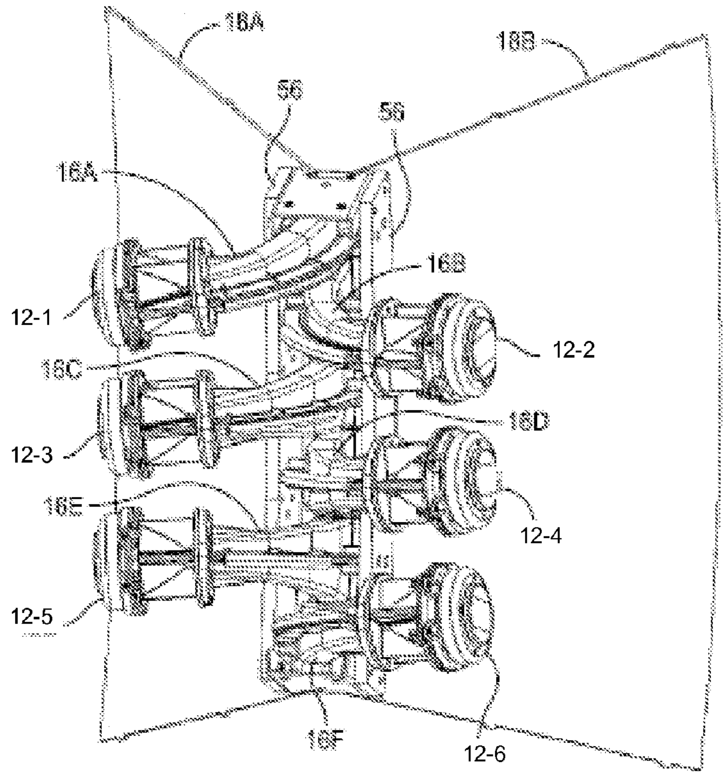
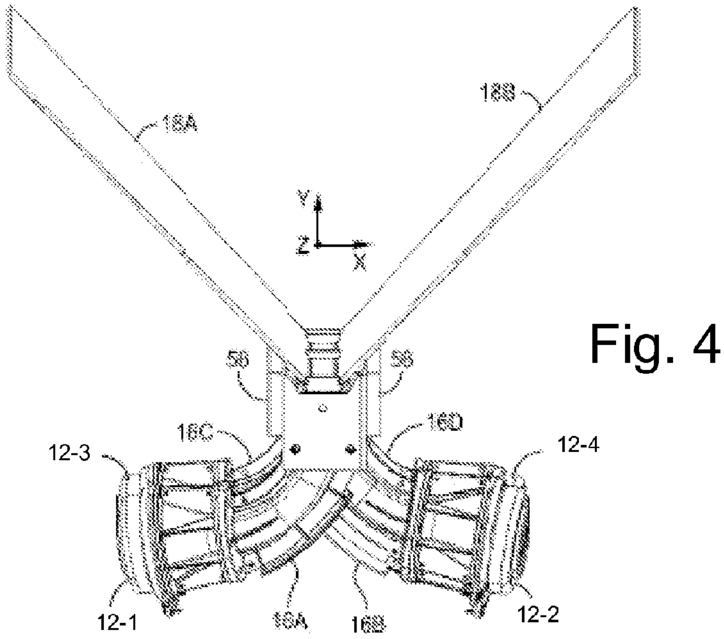
Fig. 4

ACOUSTIC HORN GAIN MANAGING

BACKGROUND

This specification describes a horn loudspeaker with gain shading.

SUMMARY

In one aspect of the specification, a horn loudspeaker includes an acoustic horn. The acoustic horn includes side walls, for determining the horizontal dispersion angle of the acoustic horn; top and bottom walls, for determining the vertical dispersion angle of the acoustic horn; a plurality of acoustic drivers coupled to the acoustic horn by a diffraction slot having segments, each of the segments separated from the adjacent segments by less than one half of the wavelength of the highest frequency of the operational range of the horn loudspeaker; and circuitry for transmitting an audio signal to the plurality of acoustic drivers. The circuitry includes a first signal attenuation element electrically coupling an audio signal input element and a first of the acoustic drivers. The circuitry may further include a second signal attenuation element coupling the acoustic signal input element and a second of the acoustic drivers. The circuitry may be configured so that the signal attenuation element electrically couples the audio signal input element and a second of the acoustic drivers. The acoustic may further include a second signal attenuation element coupling the acoustic signal input element and a third and a fourth of the acoustic drivers. The circuitry may include a single amplifier. The circuitry may include a step-down transformer. The step-down transformer may include more than two taps. Each of the plurality of acoustic drivers may be alternatively coupleable to each of the plurality of taps. Each of the segments may be separated from the adjacent segments by less than 0.81 cm.

In another aspect of the specification, an acoustic system includes an acoustic horn. The acoustic horn includes side walls and top and bottom walls, joined to form a single mouth; a plurality of acoustic drivers, acoustically coupled to the acoustic horn by respective acoustic ducts, each of the acoustic ducts having a inlet end and an outlet end. The outlet ends are coupled to form a single diffraction slot. The acoustic system further includes circuitry for providing an audio signal to the plurality of acoustic drivers. The circuitry includes a signal attenuator coupling a signal input element and at least one of the acoustic drivers. The single diffraction slot may be a segmented diffraction slot. The plurality of elongated ends may be aligned along an arc. The signal attenuator may include a step-down transformer. The circuitry may include a path that bypasses the signal attenuator. The circuitry may include a second signal attenuator coupling the signal input element and a second of the acoustic drivers. The first signal attenuator and the second signal attenuator may be incorporated in a single transformer. The single transformer may include a plurality of taps so that the attenuation of the first signal attenuator and the second signal attenuator are selectable. The circuitry may be configured so that the amplitude of the audio signal provided to the second of the acoustic drivers are substantially the same as the amplitude of the audio signal provided to a third of the acoustic drivers.

In a third aspect of the specification, an acoustic horn loudspeaker includes an acoustic horn; a plurality of acoustic drivers, acoustically coupled to the acoustic horn; and circuitry for coupling an audio signal source to the plurality of acoustic horn. The circuitry includes a step-down transformer for attenuating the audio signal provided to at least one of the acoustic drivers. The step-down transformer may include a plurality of taps so that the amount of attenuation applied to each of the plurality of acoustic drivers may be adjustable. Each of the taps may be coupleable to each of the acoustic drivers.

Other features, objects, and advantages will become apparent from the following detailed description, when read in connection with the following drawing, in which:

BRIEF DESCRIPTION OF THE SEVERAL VIEWS OF THE DRAWING

FIG. 3 is a back oblique isometric view of an assembly including acoustic drivers, acoustic ducts, and horn side walls.

FIG. 4 is a top plan view of the assembly of FIG. 3;

DETAILED DESCRIPTION

Figure 1A:
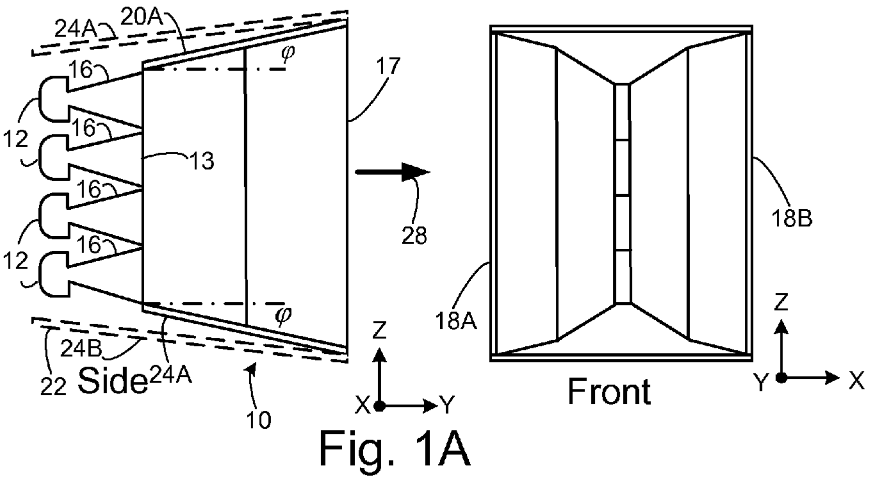
FIG. 1A is a diagrammatic side, top, and front view of an acoustic horn.

Though the elements of several views of the drawing may be shown and described as discrete elements in a block diagram and may be referred to as "circuitry", unless otherwise indicated, the elements may be implemented as one of, or a combination of, analog circuitry, digital circuitry, or one or more microprocessors executing software instructions.

This specification describes a horn loudspeaker. "Horn loudspeaker" as used herein includes one or more acoustic drivers (typically compression drivers) that radiate pressure waves into an acoustic horn, typically through a diffraction slot. The horn has side walls and top and bottom walls (or the equivalent, in case the horn has a non-rectangular shape in the cross section in the X-Z plane as shown in the coordinate system of FIG. 1 below) and acoustically loads the acoustic drivers. The top and bottom walls control the vertical directivity (that is, the dispersion in the Y-Z plane as shown in the coordinate system of FIG. 1 below) over a wide range of frequencies. The acoustic drivers may be arranged in a line and may be referred to as "line arrays". The line arrays may be acoustically coupled to the diffraction slot directly or through ducts. Sometimes two or more horn loudspeakers may be assembled in a single enclosure, as will be described below.

Line arrays may or may not be acoustically coupled to horns. The vertical dispersion angle of straight line arrays that are not coupled to horns is substantially zero, so that the vertical dispersion of a line array not acoustically coupled to a horn is determined principally by the length of the line array, the curve of the line array, or a time delay equivalent of the curve of the line array. The vertical dispersion angle of a horn is determined principally by the dispersion angle upper and lower walls of the horn.

FIG. 1A is a diagrammatic view of a horn loudspeaker 10. In the explanations that follow, a coordinate system will be used. The direction of intended radiation, indicated by arrow 28, is along the Y-axis. The X-axis is horizontal relative to the loudspeaker in the orientation of FIG. 1, and perpendicular to the Y-axis, and the Z-axis is vertical and perpendicular to the plane defined by the Y-axis and the X-axis.

A plurality, in this example four, of acoustic drivers 12 are acoustically coupled to a horn at the horn throat end 13 by acoustic ducts 16. The duct outlet end (that is, the end of the duct that is acoustically coupled to the horn) may be mechanically coupled to the horn directly. Alternatively, the outlet ends of the ducts may be combined into a manifold which is acoustically coupled to the horn. The outlet ends of the ducts may be elongated in a vertical direction relative to the front and side views. The elongated outlet openings of the acoustic ducts or the outlet of the manifold may be aligned in the direction of elongation at the horn to form a diffraction slot. The diffraction slot may be segmented, with no segment separated from an adjacent section by more than one half wavelength of the highest frequency of interest. In one implementation segments are separated from the adjacent segments by no more than ⅜ (0.375) wavelength of 16 kHz (with a corresponding wavelength of about 2.15 cm) so that the segments are separated by no more than 0.375×2.15=0.81 cm (approx 0.3 inches). The horn includes horn side walls 18A and 18B and top and bottom walls 20A and 20B. In order to show details of the side walls 18A and 18B, top and bottom walls 20A and 20B are not shown in the top view. The side walls 18A and 18B flare outwardly. In some implementations, the walls may flare outwardly linearly. In other implementations, such as the implementation of FIG. 1, the side walls 18A and 18B can have two planar sections, a first planar section 21A and 21B flaring linearly outwardly at one rate and a second planar section 23A and 23B flaring outwardly linearly at a different rate. In other implementations, the horn walls make have a different geometry. For example, the walls may flare linearly or curve outwardly according to a continuous curve, such as an exponential curve or conic curve. Additionally, the side walls may flare out asymmetrically. The top and bottom walls 20A and 20B may be flared down and up, respectively, from the mouth 17 at an angle ϕ so that the vertical dispersion angle is 2ϕ. The horn may be partially enclosed in an enclosure 22, shown in dotted line in the side view only. For reasons that will be described below, the top wall 24A and the bottom wall 24B may be non-parallel with each other and with the top and bottom 20A and 20B of the horn, respectively. The enclosure 22 may have side walls or a back wall, but they are not germane to this application and are not shown in the figures.

In operation, the acoustic drivers transduce electrical energy into acoustic energy, which is conducted to the horn. The acoustic energy enters the horn at the horn at the throat end 13 and exits the horn at the mouth 17 in a controlled and predictable radiation pattern, with the vertical dispersion angle (that is, the dispersion angle in the Y-Z plane of the coordinate system of FIG. 1) determined by the angle ϕ and the horizontal dispersion angle (that is, the dispersion angle in the X-Y plane in the coordinate system of FIG. 1) determined by the flare of the side walls 18A and 18B.

Figure 1B:
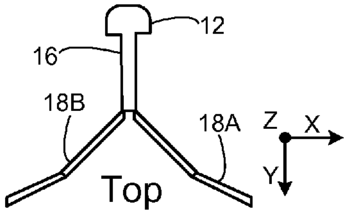
FIG. 1B is front view of a prior art arrangement with two horn loudspeakers assembled in a single enclosure.
Figure 1B:
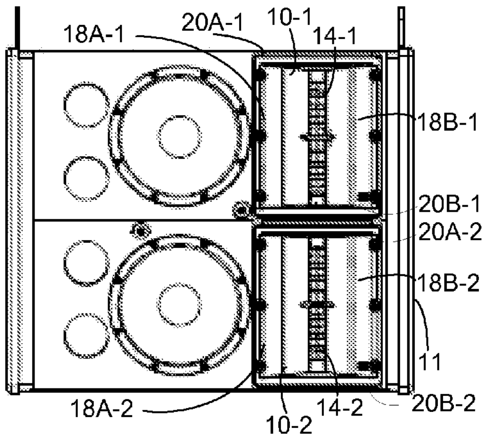

As stated above, sometimes two or more horn loudspeakers are assembled into a single enclosure. FIG. 1B shows a front view of two horn loudspeakers 10-1 and 10-2 assembled in a single enclosure 11. Each horn loudspeaker 10-1 and 10-2 includes a plurality of acoustic drivers acoustically coupled to a diffraction slot 14-1 and 14-2, respectively. Horn loudspeaker 10-1 has horn having a top wall 20A-1 and a bottom wall 20B-1, and side walls 18A-1 and 18B-1, respectively. Horn loudspeaker 10-2 has horn having a top wall 20A-2 and a bottom wall 20B-2, and side walls 18A-1 and 18B-1 respectively.

Figure 2:
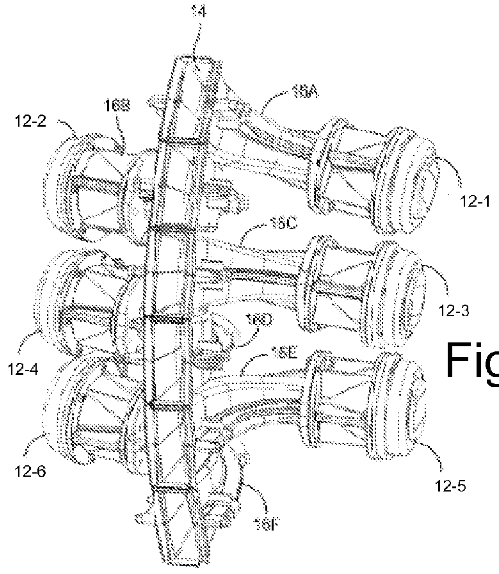
FIG. 2 is a front oblique isometric view of an acoustic assembly for use in a horn loudspeaker.

FIG. 2 shows a front oblique isometric view of an acoustic assembly for use in a horn loudspeaker according to U.S. patent application Ser. No. 12/898,947, incorporated herein by reference. The assembly includes six modules, each module including an acoustic driver 12-1 through 12-6 acoustically coupled to an acoustic duct 16A-16F at one end of the acoustic duct. The other end of the acoustic duct is a substantially planar elongated opening. The elongated openings are aligned in the direction of elongation along an arc to form a segmented diffraction slot 14.

FIGS. 3 and 4 show an oblique back isometric view a top plan view, respectively, of an acoustic driver and acoustic duct assembly according to FIG. 2, with the horn side walls 18A and 18B. In this assembly, the horn side walls 18A and 18B are not planar and have some curvature. To show the side walls 18A and 18B, the top and bottom walls are not shown in this view. In the figures, the side walls 18A and 18B are shown as flaring symmetrically in the X-Y plane. In some implementations, the side walls may flare asymmetrically in the X-Y plane. Some of the acoustic drivers and some of the acoustic ducts are not visible in FIG. 3.

Figure 5:
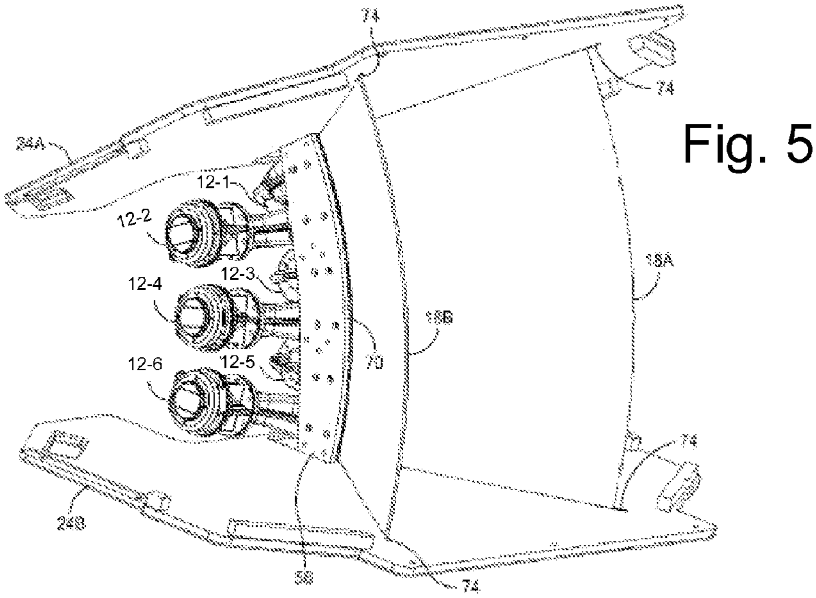
FIG. 5 is an oblique isometric front view of the assembly of FIGS. 3 and 4 further including top and bottom enclosure walls.

FIG. 5 shows an oblique isometric front view of the assembly of FIGS. 3 and 4 with top and bottom enclosure walls 24A and 24B (which are also the top and bottom horn walls in this configuration; in other configurations, the top and bottom enclosure walls may be separate from the top and bottom horn walls) angled to provide a 40 degree vertical dispersion angle. In FIG. 5, the curve of the front edge 70 of a keel 56 is visible. The top wall 24A and the bottom wall 24B may be mechanically fastened to the ends of keel 56. The enclosure 22 has no sides or back, and the same parts can be used for the top wall 24A and bottom wall 24B regardless of the vertical dispersion angle. The horn side walls 18A and 18B may be held in place by mechanical fastening to the keel 56 and by inserting the top and bottom edges of the side walls into slots 74 in the top and bottom 24A and 24B. The keel also functions as a mounting point for the acoustic assemblies so that the elongated openings (114 of previous views) are held in place along an arc to form a segmented diffraction slot.

The assembly of FIG. 5 enables providing horn loudspeakers with a wide range of vertical dispersion angle and horizontal dispersion angles with many parts that are standard for all vertical and horizontal dispersion angles and with a minimum of variation in the manufacturing process. For example, the top wall 24A, the bottom wall 24B, the acoustic drivers, acoustic ducts and the bass module may all be standard. Only the keel 56, the side bracket 57, and the horn side walls 18A and 18B need to be varied to vary the vertical dispersion angle. The horizontal dispersion angle can be varied by varying the orientation of the slots 74. The assembly process for all horn loudspeakers, regardless of vertical or horizontal dispersion angle, is substantially identical.

Figure 6:
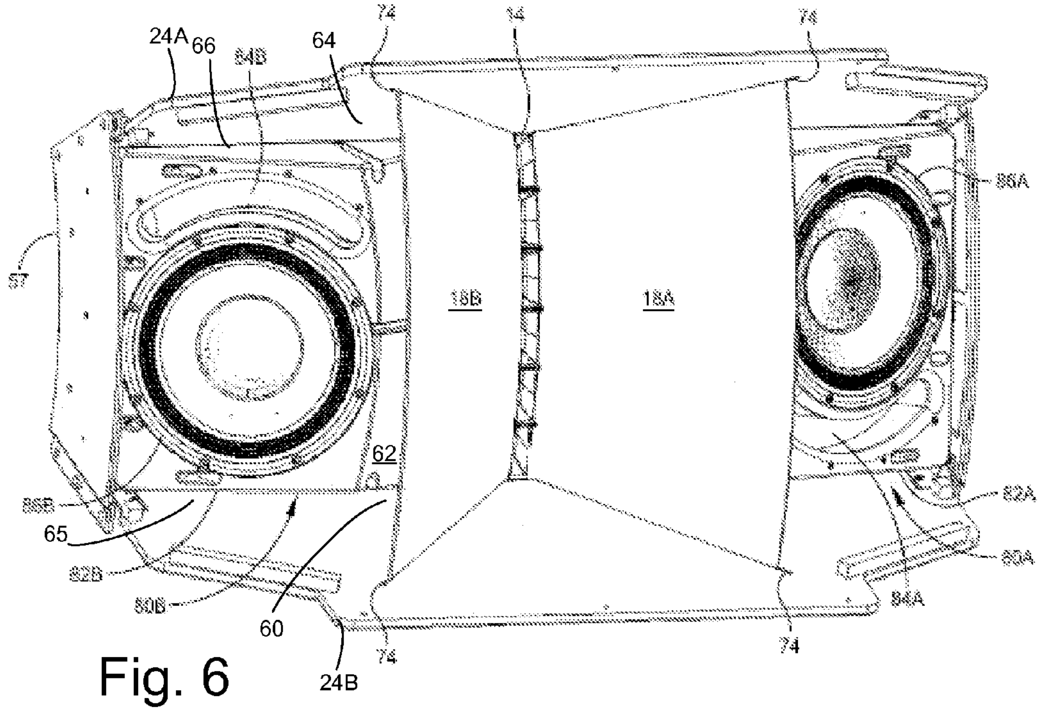
FIG. 6 is an front oblique isometric view of the assembly of FIG. 5 with bass modules.

FIG. 6 shows the assembly of FIG. 5 with bass modules 80A and 80B. Bass modules 80A and 80B may includes a 25.4 cm (10 inch) nominal woofer driver 86 mounted in a bass enclosure 82 with a port 84. The bass modules may be mechanically fastened to a side bracket 57 which may be mechanically fastened to the top wall 24A and bottom wall 24B. Elements 60, 62, 64, 65, and 66 will be explained later.

Further details of the operation and configuration of the horn loudspeaker of FIGS. 2-6 may be found in U.S. patent application Ser. No. 12/898,947.

Figure 7:
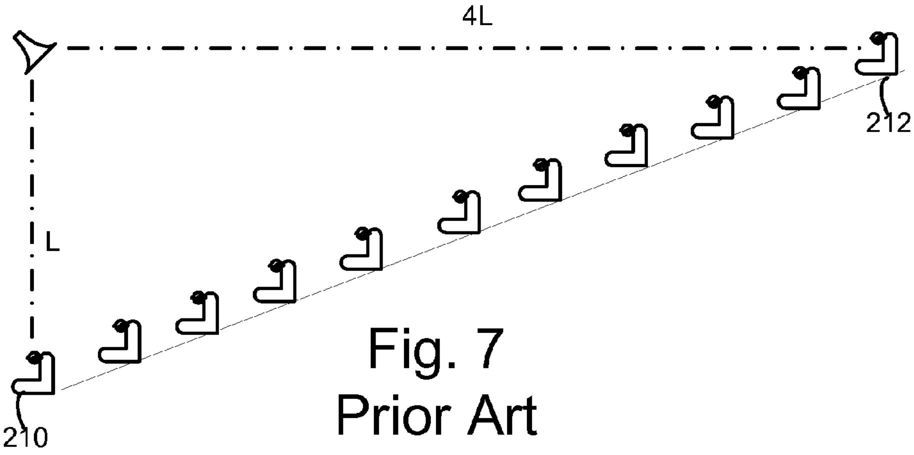
Fig. 7 Prior Art
FIG. 7 is a diagrammatic view of a horn loudspeaker in a medium-sized venue.

FIG. 7 is a diagrammatic view of a horn loudspeaker in a medium-sized venue, such as a sports arena which includes a plurality of listening locations, of progressively greater distance from a horn loudspeaker 100. The seating location 212, which is farthest from the horn loudspeaker is significantly farther away from horn loudspeaker than the closest seating location 210 (in this case about 4×, but in actual implementations much more than 4×).

In the situation of FIG. 7, it may be difficult to provide an adequate but not excessive sound pressure level (SPL) at all listening locations. With loudspeaker such as many horn loudspeakers that attempt to approximate a point source, the sound pressure level (SPL) drops off as about the square of the distance from the point source. If there is sufficient SPL at location 212, there may be excessive SPL at location 210. If there is appropriate SPL at location 210, the SPL at location 212 may be inadequate.

Figure 8:
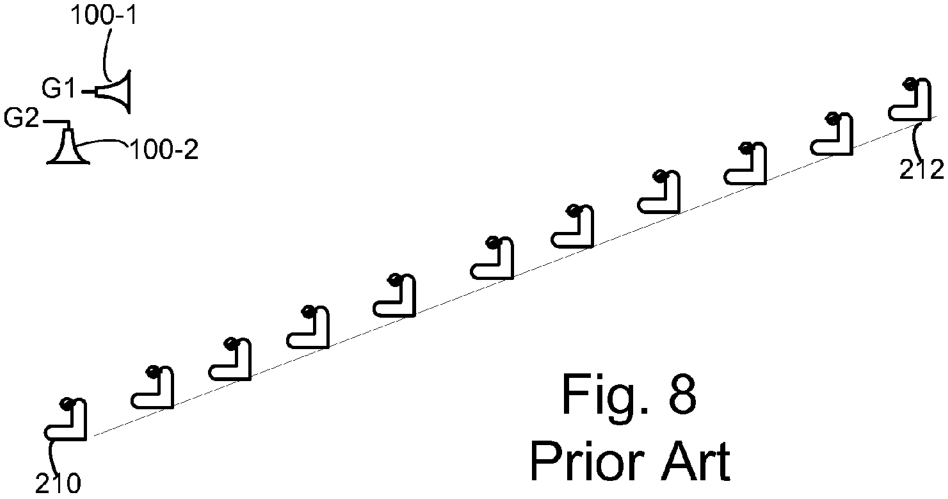
Fig. 8 Prior Art
FIG. 8 is a diagrammatic view of one prior art approach to the problem of providing adequate but not excessive SPL to locations that are at significantly different distances from a horn loudspeaker system.

FIG. 8 is a diagrammatic view of one prior art approach to the problem of providing adequate but not excessive SPL to locations that are at significantly different distances from a horn loudspeaker system. The horn loudspeaker system of FIG. 8 includes two horn loudspeakers 100-1 and 100-2 configured and positioned so that listening location 212 receives radiation primarily from horn loudspeaker 100-1 and so that listening location 210 receives radiation primarily from horn loudspeaker 100-2. In some examples, the two horns may be housed in a single enclosure as shown in FIG. 1B. Gain G1 (sufficient to provide desired SPL to seating location 212) is applied to an audio signal and the amplified audio signal is transduced to acoustic energy by horn loudspeaker 100-1. Gain G2 (<G1 and sufficient to provide SPL to seating location 210) is applied to the audio signal and the amplified audio signal is transduced to acoustic energy by horn loudspeaker 100-2. While the arrangement of FIG. 2 may provide appropriate amounts of SPL to each of the listening locations 210, and 212, it may be economically inefficient. FIG. 8 is a diagrammatic view; elements 100-1 and 100-2 do not necessarily represent the orientation or shape of an actual implementation.

Figure 9:
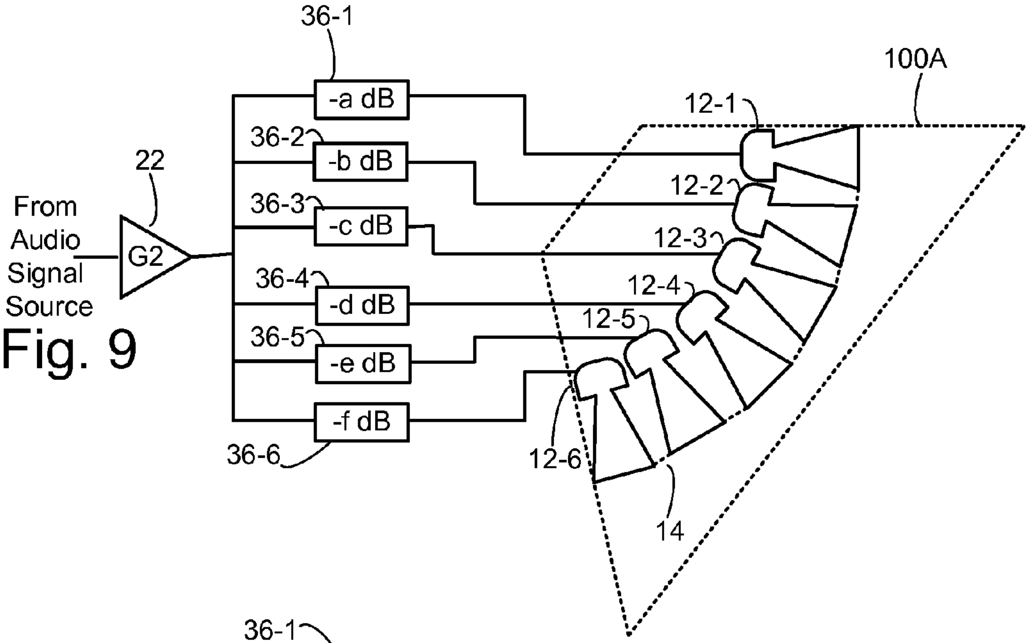
FIGS. 9-11 are diagrammatic views of horn loudspeaker systems.

FIG. 9 show a horn loudspeaker system that provides, with a single horn and a single amplifier 22 coupling audio signal source 20 and horn loudspeaker 100, adequate but not excessive SPL to locations that are at significantly different distances from the single horn.

In a first configuration, the horn 100A includes a plurality of modules, each module including an acoustic driver 12-1 . . . 12-*n* (in this example n=6) and an acoustic duct acoustically coupling the corresponding compression driver with a diffraction slot. An audio signal source is coupled to an amplifier 22. The amplifier is coupled to each of the acoustic drivers 12-1-12-*n* through signal attenuators 36-1-36-*n*, respectively In operation, the amplifier 22 amplifies an audio signal from an audio signal source to an amplitude that results in adequate SPL at the location farthest from the horn loudspeaker. The amplitudes of the signal to the acoustic drivers are attenuated so that the acoustic energy toward the most distant listening location is attenuated little or not at all and the signal to the nearest listening location is attenuated so it does not receive excessive acoustic energy. The signal to each of the other acoustic drivers is attenuated by an amount (a . . . n; in this example n=f) that results in SPL at the location 210 not being significantly greater than the SPL at location 212.

Figure 10:
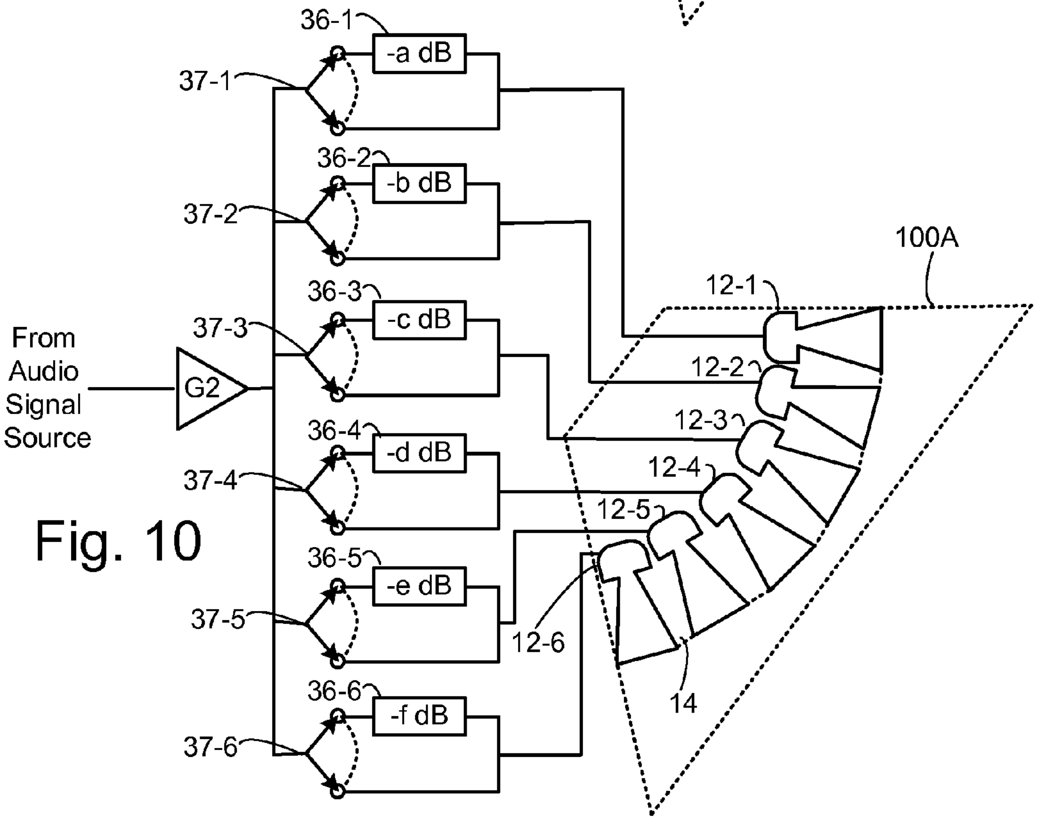

FIG. 10 shows another embodiment of a horn loudspeaker. In the embodiment of FIG. 10, there are switches between the amplifier and the acoustic drivers, so that a user has the option of attenuating or not attenuating the signal to each acoustic driver.

Figure 11:
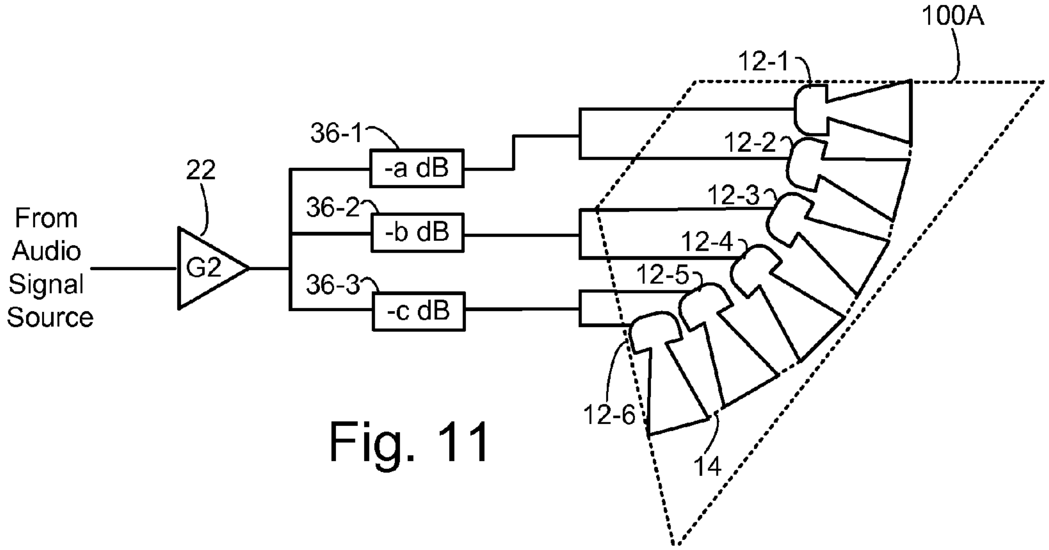

FIG. 11 shown another embodiment. In the embodiment of FIG. 11, the modules are grouped (in this example, three groups of two) and each group is coupled to the amplifier through a signal attenuator. This provide less flexibility to the user, but requires fewer part. In one implementation of FIG. 11, a=0 dB, b=1.5 dB, and c=3 dB. The horn elements are as described in U.S. patent application Ser. No. 12/898,947. The voltage attenuators are step-down transformers.

Figure 12:
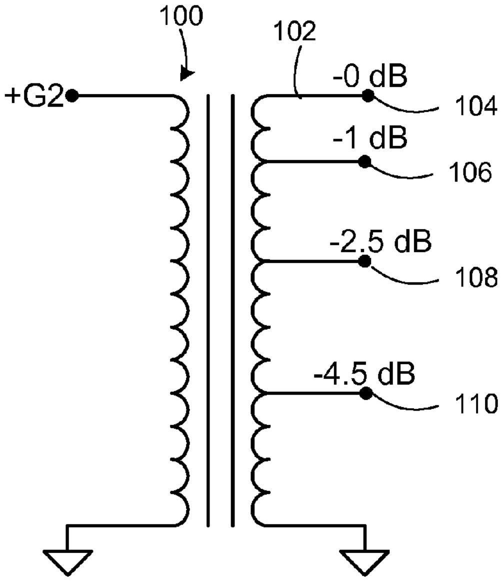
FIG. 12 is an electrical diagram of a step-down transformer with multiple taps.

FIG. 12 shows a step-down transformer 100 that can be used of one or more of the voltage attenuators 36-1-36-n of previous figures. The secondary side 102 of the step-down transformer has taps at −1 dB, −2.5 dB, and −4.5 dB. The arrangement of FIG. 12 permits a large number of choices of attenuation factors. For example, −1 dB can be attained by coupling the leads of an acoustic driver between terminal 104 and tap 106; −1.5 dB can be attained by coupling the leads of the acoustic driver to taps 106 and 108; −2 dB can be attained by coupling the leads of the acoustic driver between taps 108 and 110; −2.5 dB can be attained by coupling the leads of the acoustic driver between terminal 104 and lead tap 108; −3.5 dB can be attained by coupling the leads of the acoustic driver between taps 106 and 110; and −4.5 can be attained by coupling the leads of the acoustic driver to terminal 104 and tap 110. Adding more taps at more and different attenuations can permit even more choices of attenuation factors.

Referring again to FIG. 6, in horns built according to U.S. patent application Ser. No. 12/898,947, there may be a wedge shaped void 60 between horn wall 18B and a side wall 62 of the bass module 80B and another wedge shaped void 64 between the top wall 66 of the bass module 80B and the top enclosure wall 24A. There may be similar wedge shaped voids between horn wall 18A and the side wall of bass module 80A and between the top wall of bass module 80A and top enclosure wall 24A. The exact shape and dimensions of the voids may vary, depending on the geometry of the horn and other physical structures in the horn loudspeaker, for example bass modules. The wedge shaped voids 60 and 64 may have undesirable side effects, for example a narrowband loss (or "notch") in the output of the horn. The narrowband loss can be reduced by filling the void with acoustic absorbing material, for example open cell foam.

Figure 13:
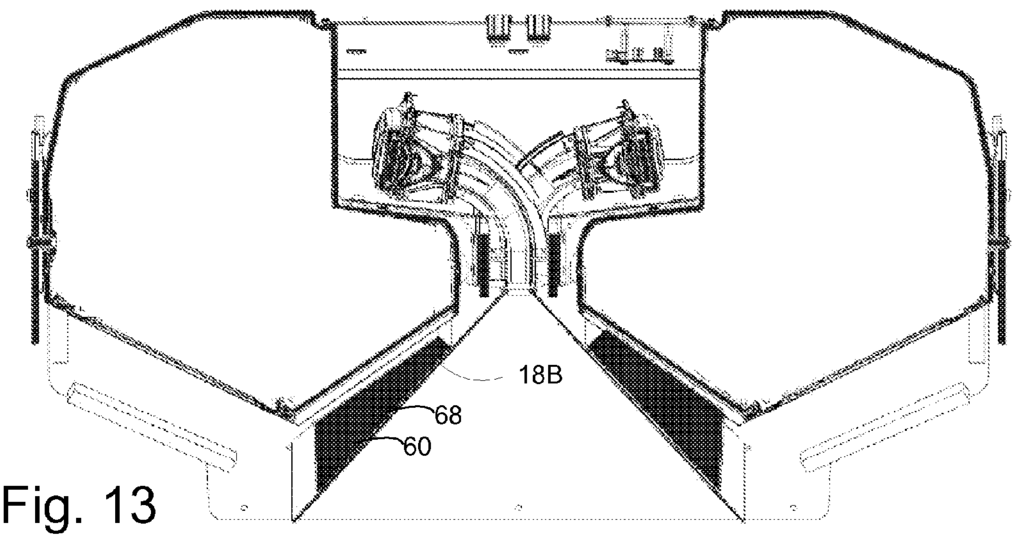
FIGS. 13 and 14 are top plan views of a horn assembly.

FIG. 13 shows a top plan view of the assembly of FIG. 6 with the top enclosure wall 24B removed to show internal detail and with some elements omitted to avoid clutter in the drawing. In FIG. 13, a three dimensional wedge shaped piece 68 of acoustically absorbing material, such as open cell foam, substantially conforming to the shape of the void 60 in placed in void 60.

Figure 14:
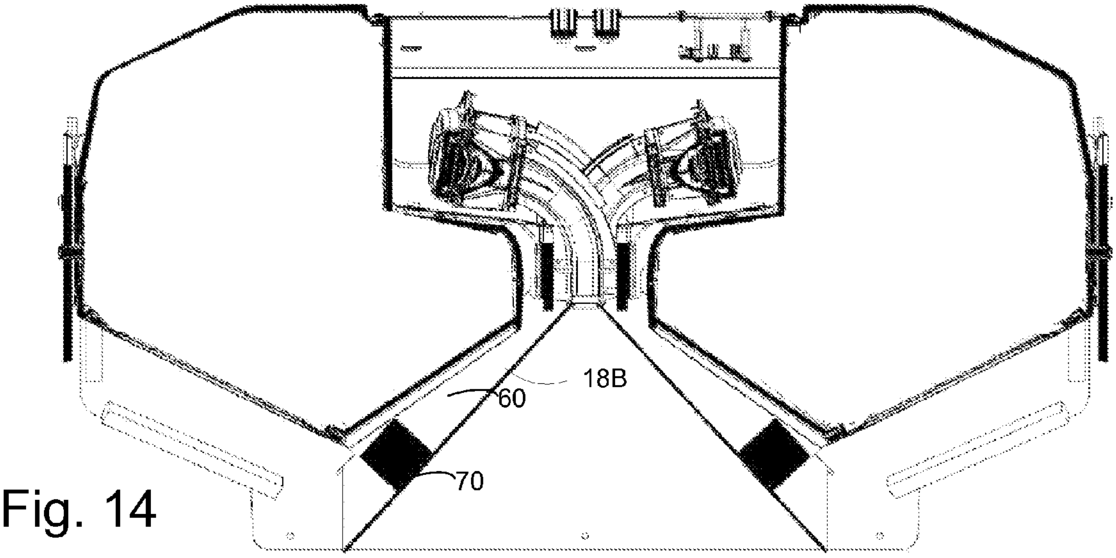

FIG. 14 shows a top plan view similar to the top plan view of FIG. 13, with another configuration for reducing the narrowband loss. In the configuration of FIG. 14, there is a first generally planar front structure 70 or "baffle" of a material such as closed cell foam that closes off the void 60 (that is, separates the void 60 from other portions of the volume within the horn enclosure and from the exterior of the horn assembly) but does not fill the void. In one example, the front structure 70 is closed cell foam about 50 mm thick.

Figure 15:
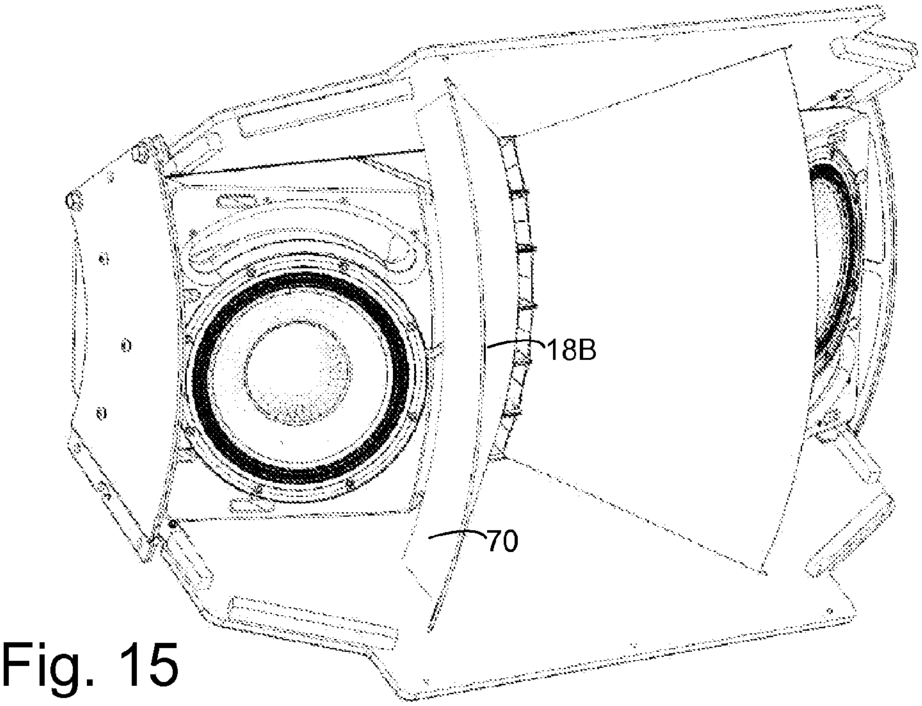
FIGS. 15 and 16 are front oblique isometric views of an acoustic assembly.

FIG. 15 is a front oblique view of the assembly of FIG. 14.

Figure 16:
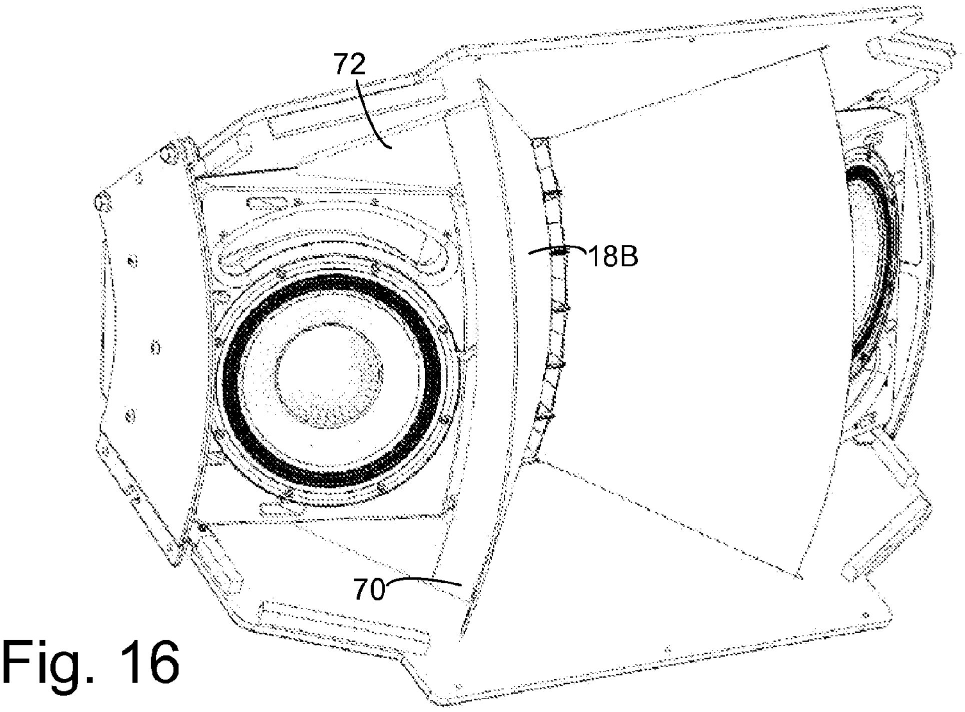

FIG. 16 is a front oblique isometric view of the assembly of FIG. 15, with an the first generally planar structure 70 and with a second generally planar front structure 72 or "baffle" of closed cell foam that closes off the void 64 (that is, separates the void from other portions of the volume within the horn enclosure and from the exterior of the horn assembly) but does not fill the void. In one example, the front structure 72 is closed cell foam about 50 mm thick. In one implementation of FIG. 15, the output of the horn loudspeaker was 2 to 3 dB over the configuration of FIG. 13 with open cell foam.

Numerous uses of and departures from the specific apparatus and techniques disclosed herein may be made without departing from the inventive concepts. Consequently, the invention is to be construed as embracing each and every novel feature and novel combination of features disclosed herein and limited only by the spirit and scope of the appended claims.

What is claimed is:

1. A horn loudspeaker, comprising:

an acoustic horn, comprising side walls, for determining a horizontal dispersion angle of the acoustic horn, and top and bottom walls, for determining a vertical dispersion angle of the acoustic horn;

a plurality of acoustic drivers coupled to the acoustic horn by a diffraction slot having segments, each of the segments separated from adjacent segments by less than one half of a wavelength of a highest frequency of an operational range of the horn loudspeaker; and a circuit for transmitting an audio signal to the plurality of acoustic drivers, the circuit comprising a first signal attenuator electrically coupling an audio signal input element and a first acoustic driver of the plurality of acoustic drivers, and a second signal attenuator electrically coupling the audio signal input element and a second acoustic driver of the plurality of acoustic drivers, wherein the first acoustic driver is directed to a first listening location, and the second acoustic driver is directed to a second listening location, the second listening location being closer to the plurality of acoustic drivers than the first listening location, and wherein the first signal attenuator applies a first attenuation to the audio signal input element, and the second signal attenuator applies a second attenuation, greater than the first attenuation, to the audio signal input element.

2. The horn loudspeaker of claim 1, the circuit configured so that the first signal attenuator electrically couples the audio signal input element and a third acoustic driver of the plurality of acoustic drivers.

3. The horn loudspeaker of claim 2, the circuit configured so that the second signal attenuator couples the audio signal input element and a fourth acoustic driver of the plurality of acoustic drivers.

4. The horn loudspeaker of claim 1, wherein the circuit comprises a single amplifier.

5. The horn loudspeaker of claim 1, wherein the circuit comprises a step-down transformer.

6. The horn loudspeaker of claim 5, wherein the step-down transformer comprises a plurality of more than two taps.

7. The horn loudspeaker of claim 6, wherein each of the plurality of acoustic drivers is able to alternatively couple to each of the plurality of more than two taps.

8. The horn loudspeaker of claim 1, wherein each of the segments is separated from adjacent segments by less than 0.81 cm.

9. An acoustic system, comprising:

an acoustic horn, comprising side walls and top and bottom walls, joined to form a single mouth;

a plurality of acoustic drivers, acoustically coupled to the acoustic horn by respective acoustic ducts, each of the acoustic ducts having an inlet end and an outlet end, wherein the outlet ends are aligned along an arc and coupled to form a single diffraction slot; and a circuit for providing an audio signal to the plurality of acoustic drivers, the circuit comprising a first signal attenuator coupling a signal input element and at least a first acoustic driver of the plurality of acoustic drivers, and a second signal attenuator coupling the signal input element and at least a second acoustic driver of the plurality of acoustic drivers, wherein the first acoustic driver is directed to a first listening location, and the second acoustic driver is directed to a second listening location, the second listening location being closer to the plurality of acoustic drivers than the first listening location, and wherein the first signal attenuator applies a first attenuation to the signal input element, and the second signal attenuator applies a second attenuation, greater than the first attenuation, to the signal input element.

10. The acoustic system of claim 9, wherein the single diffraction slot is a segmented diffraction slot.

11. The acoustic system of claim 9, wherein the first signal attenuator comprises a step-down transformer.

12. The acoustic system of claim 9, the circuit comprising a path that bypasses the first signal attenuator.

13. The acoustic system of claim 9, wherein the first signal attenuator and the second signal attenuator are incorporated in a single transformer.

14. The acoustic system of claim 13, wherein the single transformer comprises a plurality of taps so that the first attenuation and the second attenuation are selectable.

15. The acoustic system of claim 9, wherein the circuit is configured so that an amplitude of the audio signal provided to the second acoustic driver of the plurality of acoustic drivers is substantially the same as an amplitude of the audio signal provided to a third acoustic driver of the plurality of acoustic drivers.

16. An acoustic horn loudspeaker, comprising:

an acoustic horn;

a plurality of acoustic drivers, acoustically coupled to the acoustic horn by a diffraction slot having segments, wherein each of the segments is separated from adjacent segments by less than one half of a wavelength of a highest frequency of an operational range of the acoustic horn loudspeaker; and a circuit for coupling an audio signal source to the plurality of acoustic drivers, the circuit comprising a step-down transformer for attenuating an audio signal provided to at least one of the plurality of acoustic drivers, wherein the step-down transformer comprises a plurality of taps so that an amount of attenuation applied to each of the plurality of acoustic drivers is adjustable, and wherein the step-down transformer is configured to apply a first attenuation to the audio signal provided to a first acoustic driver of the plurality of acoustic drivers, the first acoustic driver being directed to a first listening location, and the step-down transformer is further configured to apply a second attenuation, greater than the first attenuation, to the audio signal provided to a second acoustic driver of the plurality of acoustic drivers, the second acoustic driver being directed to a second listening location closer to the plurality of acoustic drivers than the first listening location.

17. The acoustic horn of claim 16, wherein each of the plurality of taps is able to couple to each of the plurality of acoustic drivers.

* * * * *